(12) United States Patent
Tshagharyan et al.

(10) Patent No.: US 12,266,413 B2
(45) Date of Patent: Apr. 1, 2025

(54) BUILT-IN SELF-TEST CIRCUIT FOR ROW HAMMERING IN MEMORY

(71) Applicant: Synopsys, Inc., Mountain View, CA (US)

(72) Inventors: Grigor Tshagharyan, Yerevan (AM); Gurgen Harutyunyan, Yerevan (AM); Arun Kumar, Santa Clara, CA (US); Yervant Zorian, Santa Clara, CA (US)

(73) Assignee: Synopsys, Inc., Sunnyvale, CA (US)

( * ) Notice: Subject to any disclaimer, the term of this patent is extended or adjusted under 35 U.S.C. 154(b) by 131 days.

(21) Appl. No.: 17/946,085

(22) Filed: Sep. 16, 2022

(65) Prior Publication Data

US 2024/0096435 A1    Mar. 21, 2024

(51) Int. Cl.
*G11C 29/46* (2006.01)
*G11C 29/12* (2006.01)
*G11C 29/18* (2006.01)

(52) U.S. Cl.
CPC ......... *G11C 29/46* (2013.01); *G11C 29/1201* (2013.01); *G11C 29/18* (2013.01)

(58) Field of Classification Search
None
See application file for complete search history.

(56) References Cited

U.S. PATENT DOCUMENTS

| 5,289,475 | A | * | 2/1994 | Slemmer | G11C 29/50 365/201 |
| 5,991,213 | A | * | 11/1999 | Cline | G11C 29/56012 365/201 |
| 2010/0257415 | A1 | * | 10/2010 | Lin | G11C 29/16 711/E12.002 |
| 2017/0148528 | A1 | * | 5/2017 | Cho | G11C 29/12 |
| 2021/0200460 | A1 | * | 7/2021 | Lu | G06F 3/0653 |
| 2021/0304836 | A1 | * | 9/2021 | Lee | G11C 7/1057 |
| 2022/0179738 | A1 | * | 6/2022 | Sharifi Tehrani | G06F 11/3037 |
| 2022/0189573 | A1 | * | 6/2022 | Kim | G11C 11/40622 |
| 2022/0293166 | A1 | * | 9/2022 | Ayyapureddi | G11C 11/40611 |
| 2023/0139518 | A1 | * | 5/2023 | Liu | G01R 31/3171 714/704 |
| 2023/0162776 | A1 | * | 5/2023 | Kim | G11C 11/40603 365/222 |

* cited by examiner

*Primary Examiner* — J. H. Hur
(74) *Attorney, Agent, or Firm* — Patterson + Sheridan, LLP

(57) ABSTRACT

A method for testing a chip includes writing, by a built-in self-test (BIST) circuit of the chip, a first row of a memory of the chip with a first set of values and reading, by the BIST circuit, a second row of the memory a first plurality of times. The second row is adjacent to the first row. The method also includes reading, by the BIST circuit, the first row to extract a second set of values from the first row and based on determining that at least one of the second set of values differs from a corresponding one of the first set of values, designating the first row as a vulnerable row.

16 Claims, 6 Drawing Sheets

108

| | | | | | |
|---|---|---|---|---|---|
| 0 | 0 | 0 | ... | 0 | 0 |
| 0 | 0 | 0 | ... | 0 | 0 |
| 0 | 0 | 0 | ... | 0 | 0 |
| 1 | 1 | 1 | ... | 1 | 1 |
| 0 | 0 | 0 | ... | 0 | 0 |
| ... | | | | | |
| 0 | 0 | 0 | ... | 0 | 0 |
| 0 | 0 | 0 | ... | 0 | 0 |

202A → (row 3), 202B → (row 4), 202C → (row 5)

| | | | | | |
|---|---|---|---|---|---|
| 0 | 0 | 0 | ... | 0 | 0 |
| 0 | 0 | 0 | ... | 0 | 0 |
| R0 | R0 | R0 | ... | R0 | R0 |
| 1 | 1 | 1 | ... | 1 | 1 |
| R0 | R0 | R0 | ... | R0 | R0 |
| ... | | | | | |
| 0 | 0 | 0 | ... | 0 | 0 |
| 0 | 0 | 0 | ... | 0 | 0 |

202A → (row 3), 202B → (row 4), 202C → (row 5)

| | | | | | |
|---|---|---|---|---|---|
| 0 | 0 | 0 | ... | 0 | 0 |
| 0 | 0 | 0 | ... | 0 | 0 |
| 0 | 0 | 0 | ... | 0 | 0 |
| 1 | 1→0 | 1 | ... | 1 | 1 |
| 0 | 0 | 0 | ... | 0 | 0 |
| ... | | | | | |
| 0 | 0 | 0 | ... | 0 | 0 |
| 0 | 0 | 0 | ... | 0 | 0 |

202A → (row 3)
202B → (row 4)
202C → (row 5)

| | | | | | |
|---|---|---|---|---|---|
| 0 | 0 | 0 | ... | 0 | 0 |
| 0 | 0 | 0 | ... | 0 | 0 |
| 0 | 0 | 0 | ... | 0 | 0 |
| R1 | R1→0 | R1 | ... | R1 | R1 |
| 0 | 0 | 0 | ... | 0 | 0 |
| ... | | | | | |
| 0 | 0 | 0 | ... | 0 | 0 |
| 0 | 0 | 0 | ... | 0 | 0 |

202A → (row 3)
202B → (row 4)
202C → (row 5)

FIG. 6

BUILT-IN SELF-TEST CIRCUIT FOR ROW HAMMERING IN MEMORY

TECHNICAL FIELD

The present disclosure relates to chips, and more specifically, to a built-in self-test (BIST) circuit for a memory (e.g., in a memory chip or another integrated circuit chip).

BACKGROUND

Row hammering is a vulnerability in memory (e.g., dynamic random access memory (DRAM)) that causes data stored in certain rows to be disturbed when adjacent rows are accessed multiple times. This vulnerability may be exploited as a disturbance attack to breach system security and to gain unauthorized access.

SUMMARY

The present disclosure describes a chip with a built-in self-test (BIST) circuit that tests a memory of the chip for row hammering vulnerabilities. According to an embodiment, a method for testing a chip includes writing, by a BIST circuit of the chip, a first row of a memory of the chip with a first set of values and reading, by the BIST circuit, a second row of the memory a first plurality of times. The second row is adjacent to the first row. The method also includes reading, by the BIST circuit, the first row to extract a second set of values from the first row and based on determining that at least one of the second set of values differs from a corresponding one of the first set of values, designating the first row as a vulnerable row.

The method may include reading, by the BIST circuit, a third row of the memory a second plurality of times. The third row may be adjacent to the first row.

The method may include refraining from storing a portion of data to the first row based on designating the first row as a vulnerable row.

Reading the second row the first plurality of times may cause the corresponding one of the first set of values to change to the at least one of the second set of values.

The at least one of the second set of values may include a flipped bit relative to the corresponding one of the first set of values.

The chip may be packaged.

The method may include programming the BIST circuit to designate the first row as a vulnerable row based on determining that the at least one of the second set of values differs from the corresponding one of the first set of values.

According to another embodiment, a chip includes a memory and a BIST circuit. The BIST circuit writes a first row of the memory with a first set of values and reads a second row of the memory a first plurality of times. The second row is adjacent to the first row. The BIST circuit also reads the first row to extract a second set of values from the first row and based on determining that at least one of the second set of values differs from a corresponding one of the first set of values, designates the first row as a vulnerable row.

The BIST circuit may read a third row of the memory a second plurality of times. The third row may be adjacent to the first row.

The chip may include a memory controller that stores a portion of data in a third row of the memory rather than the first row based on designating the first row as a vulnerable row.

Reading the second row the first plurality of times may cause the corresponding one of the first set of values to change to the at least one of the second set of values.

The at least one of the second set of values may include a flipped bit relative to the corresponding one of the first set of values.

The chip may include a packaging around the memory and the BIST circuit.

The BIST circuit may execute instructions to designate the first row as a vulnerable row based on determining that the at least one of the second set of values differs from the corresponding one of the first set of values.

According to another embodiment, a non-transitory computer readable medium stores instructions that, when executed by a processor, cause the processor to initialize, by a BIST circuit of a chip, a first row, a second row, and a third row of a memory of the chip. The first row is initialized with a first set of values. The second row and the third row are adjacent to the first row. The processor also writes, by the BIST circuit, the first row with a second set of values opposite to the first set of values and reads, by the BIST circuit, the second row and the third row a plurality of times. The processor further reads, by the BIST circuit, the first row to extract a third set of values from the first row and based on determining that at least one of the third set of values differs from a corresponding one of the second set of values, refrains from writing a portion of data to the first row.

The processor may designate the first row as a vulnerable row based on determining that the at least one of the third set of values differs from the corresponding one of the second set of values.

The BIST circuit may be programmed to designate the first row as a vulnerable row based on determining that the at least one of the third set of values differs from the corresponding one of the second set of values. The processor may re-program the BIST circuit after designating the first row as a vulnerable row.

The at least one of the third set of values may include a flipped bit relative to the corresponding one of the second set of values.

The chip may be packaged.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

FIG. 3 illustrates an example memory in the system of FIG. 1.

FIG. 4 illustrates an example memory in the system of FIG. 1.

FIG. 5 illustrates an example memory in the system of FIG. 1.

FIG. 6 illustrates an example memory in the system of FIG. 1.

DETAILED DESCRIPTION

Figures 1, 2:
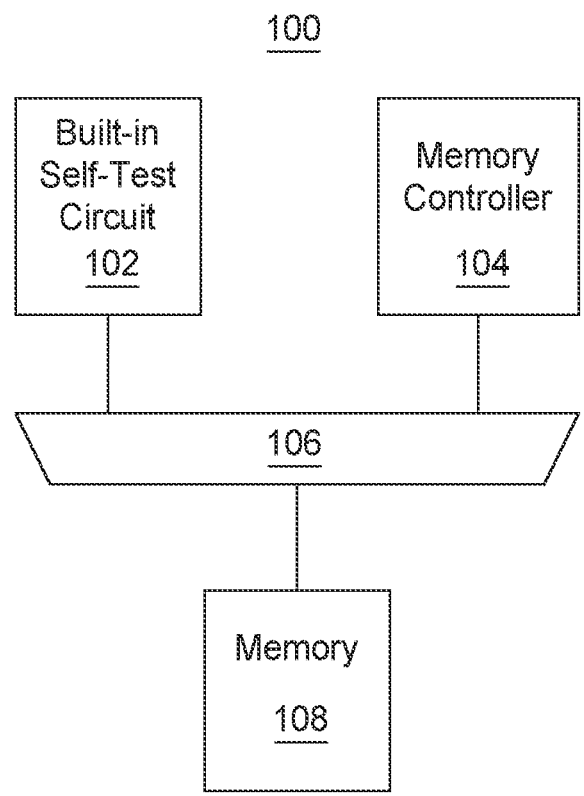
FIG. 1 illustrates an example system.
FIG. 2 illustrates an example memory in the system of FIG. 1.

Aspects of the present disclosure relate to built-in self-test (BIST) circuit for a chip (e.g., a memory chip or another integrated circuit chip). Row hammering may expose certain vulnerabilities in memory (e.g., dynamic random-access memory (DRAM)). The reason behind this phenomenon is the high density of chip arrays and the leakage of stored charge from the accessed memory cells as a result of electrical interaction between memory cells. With memory technology scaling down to smaller physical dimensions and getting denser, it becomes increasingly difficult to prevent memory cells from interacting electrically with each other. As a result, the magnitude of row hammering is increasing at smaller technology nodes, becoming a major reliability problem.

Moreover, in the field, exacerbated by aging, the row hammering problem has potential to become a critical reliability concern. Due to its intrinsic characteristics, chips (e.g., memory chips) are often used in computer architectures, usually storing highly sensitive information. In some scenarios, the row hammering vulnerability can be exploited as a disturbance attack to breach the system security and gain unauthorized access. One possible scenario would be gaining kernel privileges using row hammering-induced bit flips in page table entries of the operating system.

Row hammering, however, is usually not tested during the system design, but only tested at a later stage when more effort may be required to apply countermeasures. Meanwhile, early detection of vulnerable rows can help prevent row hammering from becoming a critical in-system security and reliability problem. The present disclosure describes a chip with a BIST circuit that tests for rows of a memory that are vulnerable to row hammering. The BIST circuit may be used to test which rows of the memory are vulnerable after the chip has been packaged. The vulnerable rows may be logged so that sensitive information is not subsequently written to these vulnerable rows. A user may have indicated the information is sensitive when the user provided the information, or another component (e.g., a processor) may have analyzed the information and determined that the information is sensitive. In either case, the information may be accompanied by a flag that indicates the information is sensitive.

The BIST circuit may test a row of the memory by initializing the memory to a first set of values (e.g., all logic 0's). The BIST circuit then writes the row under test with a second set of values (e.g., all logic 1's). The BIST circuit then reads out the values of one or more adjacent rows (e.g., all logic 0's) to the row under test multiple times. After the multiple reads are complete, the BIST circuit reads out the values from the row under test. If any of these values changed from the second set of values, then the BIST circuit may designate the row as being vulnerable to row hammering. For example, the BIST circuit may log the vulnerable row in a memory controller on the chip, which may ensure that sensitive information is not subsequently written to the vulnerable row.

Certain embodiments provide several technical advantages. For example, the BIST circuit allows the chip to be tested for row hammering vulnerabilities after the chip has been packaged and before the chip is installed in a computer system. As a result, vulnerable rows may be detected before the chip is put in use. Additionally, the BIST circuit may improve the security of the system by detecting the rows of the memory that are vulnerable to row hammering and preventing sensitive information from being written to the vulnerable rows.

FIG. 1 illustrates an example system 100. Generally, the system 100 may be a chip (e.g., a memory chip or another integrated circuit chip) that has been packaged. As seen in FIG. 1, the system 100 includes a built-in self-test (BIST) circuit 102, a memory controller 104, a multiplexer 106, and a memory 108. In certain embodiments, the BIST circuit 102 executes a row hammering test on the memory 108 to detect rows in the memory 108 that are vulnerable to row hammering. Vulnerable rows may be recorded or logged so that sensitive information is not written to those rows after the system 100 is installed in a production system (e.g., the computer system 900 shown in FIG. 9).

The BIST circuit 102 includes electronic circuitry (e.g., a controller and memory) that execute programmed tests against the memory 108. The BIST circuit 102 may be programmed to execute or perform any suitable test against the memory 108. The BIST circuit 102 may also be reprogrammed to perform additional or new tests on the memory 108. In certain embodiments, the BIST circuit 102 is programmed to perform a row hammering test on the memory 108 to detect rows in the memory 108 that are vulnerable to row hammering. During this test, the BIST circuit 102 initializes the rows of the memory 108 to initial values (e.g., any suitable set of values including all logic 0's). The BIST circuit 102 then writes a row to be tested with new values (e.g., any suitable set of values including all logic 1's). The BIST circuit 102 reads rows that are adjacent to the tested row multiple times. After these reads are performed, the BIST circuit 102 reads out the row to be tested. The BIST circuit 102 then compares the values read out from the row to be tested to see if any of the values have changed (e.g., flipped from logic 1 to logic 0). If any of the bits in the row have changed, the BIST circuit 102 may determine that the row is vulnerable to row hammering. The BIST circuit 102 may then log or record the row so that sensitive information is not written to that tested row after the system 100 is installed in a production system. For example, the BIST circuit 102 may log or record the row in the memory controller 104 so that the memory controller 104 does not subsequently write sensitive information to that row. In this manner, the BIST circuit 102 detects rows of the memory 108 that are vulnerable to row hammering and prevents sensitive information from being written to or stored in those rows which improves the security of the system 100, in certain embodiments.

The memory controller 104 executes instructions against the memory 108. For example, the memory controller 104 may perform read or write operations on the memory 108. The read operations may extract values from the memory 108. The write operation may store values into the memory 108. For example, the memory controller 104 may write sensitive information to the memory 108. The memory controller 104 may select a row of the memory 108 that is determined, by the BIST circuit 102, to not be vulnerable to row hammering. The memory controller 104 may then write the sensitive information to that row. The memory controller 104 may operate separately from the BIST circuit 102. For example, when the memory controller 104 is performing operations on the memory 108, the BIST circuit 102 may not be performing operations on the memory 108. Likewise, when the BIST circuit 102 is executing a test against the memory 108, the memory controller 104 is not performing operations on the memory 108.

The multiplexer 106 controls which of the BIST circuit 102 and the memory controller 104 is performing operations on the memory 108. The multiplexer 106 may include a control line that adjusts whether the multiplexer 106 allows commands from the BIST circuit 102 or the memory controller 104 to pass to the memory 108. The control line may be toggled by a user or administrator of the system 100. When the user or administrator wants to execute a test against the memory 108, the user or administrator may toggle the control line of the multiplexer 106 so that the multiplexer 106 passes the output of the BIST circuit 102 to the memory 108 and prevents the output of the memory controller 104 from passing to the memory 108. When the user or administrator wants to use the memory 108 in normal operation, the user or administrator may toggle the control line of the multiplexer 106 so that the multiplexer 106 passes the output of the memory controller 104 to the memory 108 and prevents the output of the BIST circuit 102 from passing to the memory 108.

In some embodiments, the multiplexer 106 may also provide de-multiplexer features. For example, the multiplexer 106 may be a multiplexer/de-multiplexer. The de-multiplexer features may control where the output of the memory 108 is sent. For example, the control line may be toggled by a user or administrator so that the multiplexer/de-multiplexer passes the output of the memory 108 to the BIST circuit 102 or to the memory controller 104.

The memory 108 may store information for subsequent use. The memory 108 may include rows into which the information is stored. Some of the rows of the memory 108 may be vulnerable to row hammering. When a row is vulnerable to row hammering, the values stored in that row may change when the values of adjacent rows are read out of the memory 108. The BIST circuit 102 may perform a test against the rows of the memory 108 to detect which rows are vulnerable to row hammering. As a result, the system 100 may be tested during post-packaging to determine which rows of the memory 108 are vulnerable to row hammering, in certain embodiments.

FIGS. 2 through 6 illustrate an example memory 108 in the system 100 of FIG. 1 at different stages of a row hammering test. As seen in FIG. 2, the memory 108 includes multiple rows that can store data or information. In the example of FIG. 2, the memory 108 includes the rows 202A, 202B, and 202C. The rows of the memory 108 are also initialized to initial values. For example, the rows 202A, 202B, and 202C are initialized to all logic 0's. After the rows 202A, 202B, and 202C are initialized, a row hammering test may be performed to determine whether the row 202B is vulnerable to row hammering.

After the rows of the memory 108 are initialized, the row to be tested may be written with a different set of values. As seen in FIG. 3, the row 202B of the memory 108 is written with all 1's. As a result, the row 202B contains values that are different from the rows 202A and 202C. The row 202B may be written with a different set of values at this stage of the row hammering test depending on the set of values initially written into memory 108. For example, memory 108 may be initialized with a certain number of logic 1's and a certain number of logic 0's, then row 202B may be written with an opposite set of values of logic 1's and logic 0's to the initialized memory 108.

One or more of its adjacent rows are read out of the memory 108 multiple times. As seen in FIG. 4, after the row 202B is written with a set of values (e.g., 1's), the row hammering test may proceed by reading out (RO) the values from one or more of the rows 202A and 202C multiple times (e.g., a number of times that is programmed into the BIST circuit 102). In some embodiments, only the row 202A or only the row 202C is read out from the memory 108 multiple times. In certain embodiments, both the rows 202A and 202C are read out from the memory 108 multiple times. If the row 202B is vulnerable to row hammering, when one or more of the rows 202A and 202C are read out from the memory 108, one or more of the values in the row 202B may change. If the row 202B is not vulnerable to row hammering, when one or more of the rows 202A and 202C are read out from the memory 108 multiple times, the values stored in the row 202B may not change.

As seen in FIG. 5, after one or more of the rows 202A and 202C are read out from the memory 108 multiple times, one or more of the values in the row 202B may have changed. For example, one of the logic 1's stored in the row 202B may have changed to a logic 0. This change from a logic 1 to a 0 indicates that the row 202B is vulnerable to row hammering.

The row under test is read out to determine if any of its stored values changed. As seen in FIG. 6, after one or more of the rows 202A and 202C are read out from the memory 108 multiple, the row 202B is read out from the memory 108. When the row 202B is read out from the memory 108, the values stored in the row 202B are extracted from the memory 108. The BIST circuit 102 may analyze the values read out from the row 202B to see if any of the values changed during the row hammering test. In the example of FIG. 6, the BIST circuit 102 reads out all bits from the row 202B including the bit that changed from a logic 1 to a 0. The BIST circuit 102 may detect that the logic 1 has changed to a 0 and determine that the row 202B is vulnerable to row hammering. The BIST circuit 102 may then log or record the row 202B so that sensitive information is not written to the row 202B when the memory 108 is installed in a production system. As a result, the security of the sensitive information is improved in certain embodiments.

In an example embodiment, the BIST circuit 102 executes a programmed test against the memory 108 to test for row hammering vulnerabilities. As discussed above, a goal of the BIST circuit 102 is to identify vulnerable memory rows at the post-package test stage with the help of BIST circuit 102, and thereby avoid the row hammering problem in a production environment. The row hammering test helps identify potential risks at an early stage of system integration and therefore makes it easier to apply appropriate countermeasures (for instance, move the sensitive data into verified non-vulnerable rows). This is especially important for security critical systems, as it helps to reduce the cost of attack prevention at the expense of test time increase.

In some embodiments, the row hammering test is executed at system speed (e.g., using the functional clock of the system 100 rather than a slower testing clock) and can be applied both during manufacturing and in-field. During manufacturing, the test checks the resistance of each memory row to row hammering. The row hammering test may be performed over the full memory address space. When in-field, a user or administrator may periodically verify if the memory rows are still resistant against row hammering (e.g., upon power-on, the user may check hammer-resistance of a small set of memory rows where critical information is going to be stored). The row hammering test can be run for a user-defined memory address range.

In a first example, a one-sided row hammering test is performed. One of the memory rows adjacent to a row under test is repeatedly accessed to potentially cause a bit flip in the row under test:

1. $\Leftrightarrow\{W(S0)\}$;
2. $\Leftrightarrow=\{\text{Refresh}, W(\sim S0), R(\sim S0)^N, RADJ(S0), W(S0)\}$.

$R(\sim S0)^N$: loop $R(\sim S0)$ test operation N times to imitate hammering effect on the current row
$\Leftrightarrow$: the linear addressing direction (up or down)
W: the write operation to the current address
R: the read operation from the current address
RADJ: the read operation from adjacent rows of the current row
Refresh: manually refresh the memory row content
S0: the solid 0 background pattern
~S0: the solid 1 background pattern In a second example, a two-sided row hammering test is performed. Two memory rows adjacent to a row under test are repeatedly accessed to potentially cause a bit flip in the row under test:

1. $\Leftrightarrow\{W(S0)\}$;
2. $\Leftrightarrow\{\text{Refresh}, W(\sim S0), RADJ(S0)^N, R(\sim S0), W(S0)\}$.

$RADJ(S0)^N$: loop $RADJ(S0)$ test operation N times to imitate hammering effect on two adjacent rows of the current row.

These example test algorithms (the one-sided and two-sided row hammering tests) provide a trade-off between test time and the probability to detect vulnerable rows. In both test algorithms, the address range may be determined depending on the operation mode (full address range for manufacturing mode and custom range for in-field mode). In both cases, the auto-refresh is disabled and manual refresh may be used at the beginning of the march test string (e.g., $\Leftrightarrow\{\text{Refresh}, W(\sim S0), R(\sim S0)^N, RADJ(S0), W(S0)\}$ and $\Leftrightarrow\{\text{Refresh}, W(\sim S0), RADJ(S0)^N, R(\sim S0), W(S0)\}$) to use the full refresh interval for the row hammering test. The bits in dynamic memory may need to be refreshed periodically (e.g., every 64 milliseconds), which may be understood to be the refresh interval of the memory.

Figure 7:
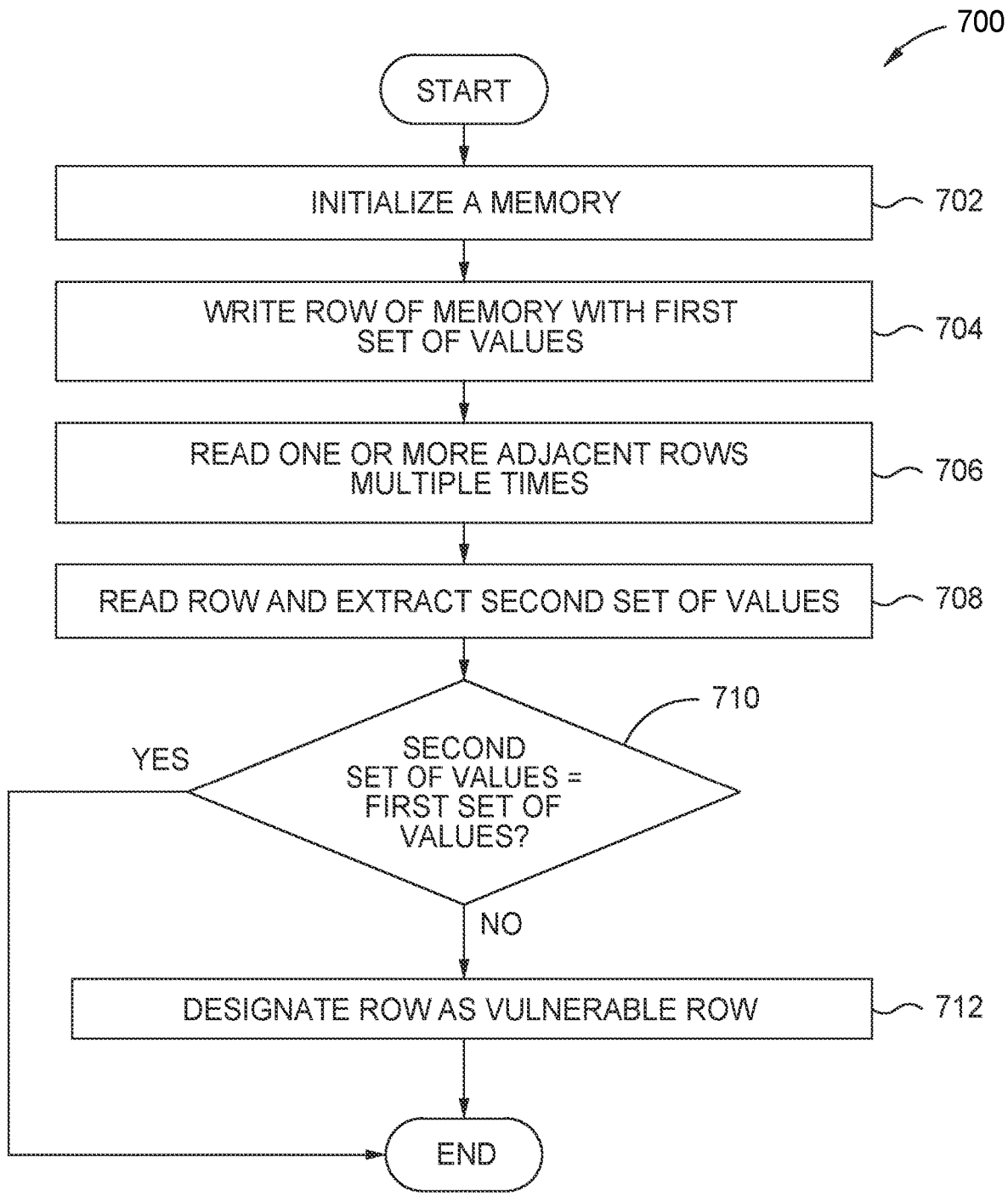
FIG. 7 is a flowchart of an example method performed in the system of FIG. 1.

FIG. 7 is a flow chart of an example method 700 performed in the system 100 of FIG. 1. In particular embodiments, the BIST circuit 102 performs the method 700. By performing the method 700, the BIST circuit 102 detects rows of the memory 108 that are vulnerable to row hammering during a post packaging stage. Additionally, the BIST circuit 102 may prevent sensitive information from subsequently being written to rows of the memory 108 that are sensitive to row hammering.

At 702, the BIST circuit 102 initializes the memory 108. Specifically, the BIST circuit 102 may initialize the rows of the memory 108 with an initial set of values (e.g., all logic 0's). At 704, the BIST circuit 102 writes a row of the memory 108 with a first set of values. This row may be a row that is being tested for row hammering vulnerabilities. The BIST circuit 102 may write this row with a particular set of values (e.g., all logic 1's).

At 706, the BIST circuit 102 continues the row hammering test by reading one or more rows that are adjacent to the row to be tested multiple times. For example, if the row to be tested has two adjacent rows, the BIST circuit 102 may read one or both of these rows multiple times. As a result, the BIST circuit 102 may read out the initial values of one or more of these adjacent rows multiple times. If the row to be tested is vulnerable to row hammering, then one or more of the values stored in that row may change when one or more of the adjacent rows are read out multiple times.

At 708, the BIST circuit 102 reads the row under test to extract a second set of values. At 710, the BIST circuit 102 compares the second set of values with the first set of values that was originally written to the row under test. If the second set of values matches the first set of values, then the BIST circuit 102 determines that the row under test is not vulnerable to row hammering. If the second set of values does not match the first set of values, then the BIST circuit 102 determines that the row under test is vulnerable to row hammering. At 712, the BIST circuit 102 designates the row as a vulnerable row. For example, the BIST circuit 102 may record or log the row as a vulnerable row. The BIST circuit 102 may inform the memory controller 104 that the row is vulnerable to row hammering. As a result, when the memory 108 is installed in a production system, the memory controller 104 may prevent sensitive information from being written to the vulnerable row. As a result, the security of the sensitive information is improved in certain embodiments.

The BIST circuit 102 may repeat the method 700 any suitable number of times to test any suitable number of rows of the memory 108. For example, the BIST circuit 102 may repeat the method 700 to test each row of the memory 108 to determine every row in the memory 108 that is vulnerable to row hammering. As a result, the BIST circuit 102 may detect every row of the memory 108 that is vulnerable to row hammering during a post packaging stage. The BIST circuit 102 may select rows for testing in any suitable manner. For example, the BIST circuit 102 may select the rows in a round robin fashion. As another example, the BIST circuit 102 may be programmed to select particular rows for testing.

A chip includes a BIST circuit 102 that tests for rows of a memory 108 that are vulnerable to row hammering. The BIST circuit 102 may be used after the chip has been packaged to test which rows of the memory 108 are vulnerable. The vulnerable rows may be logged so that sensitive information is not subsequently written to these vulnerable rows.

The BIST circuit 102 may test a row of the memory 108 by initializing the memory 108 to a first set of values (e.g., all logic 0's). The BIST circuit 102 then writes the row with a second set of values (e.g., all logic 1's). The BIST circuit 102 then reads out the values of one or more adjacent rows (e.g., all logic 0's) multiple times. After the multiple reads are complete, the BIST circuit 102 reads out the values from the row under test. If any of these values changed from the second set of values, then the BIST circuit 102 may designate the row as being vulnerable to row hammering. For example, the BIST circuit 102 may log the vulnerable row in a memory controller 104 on the chip, which may ensure that sensitive information is not subsequently written to the vulnerable row.

Figure 8:
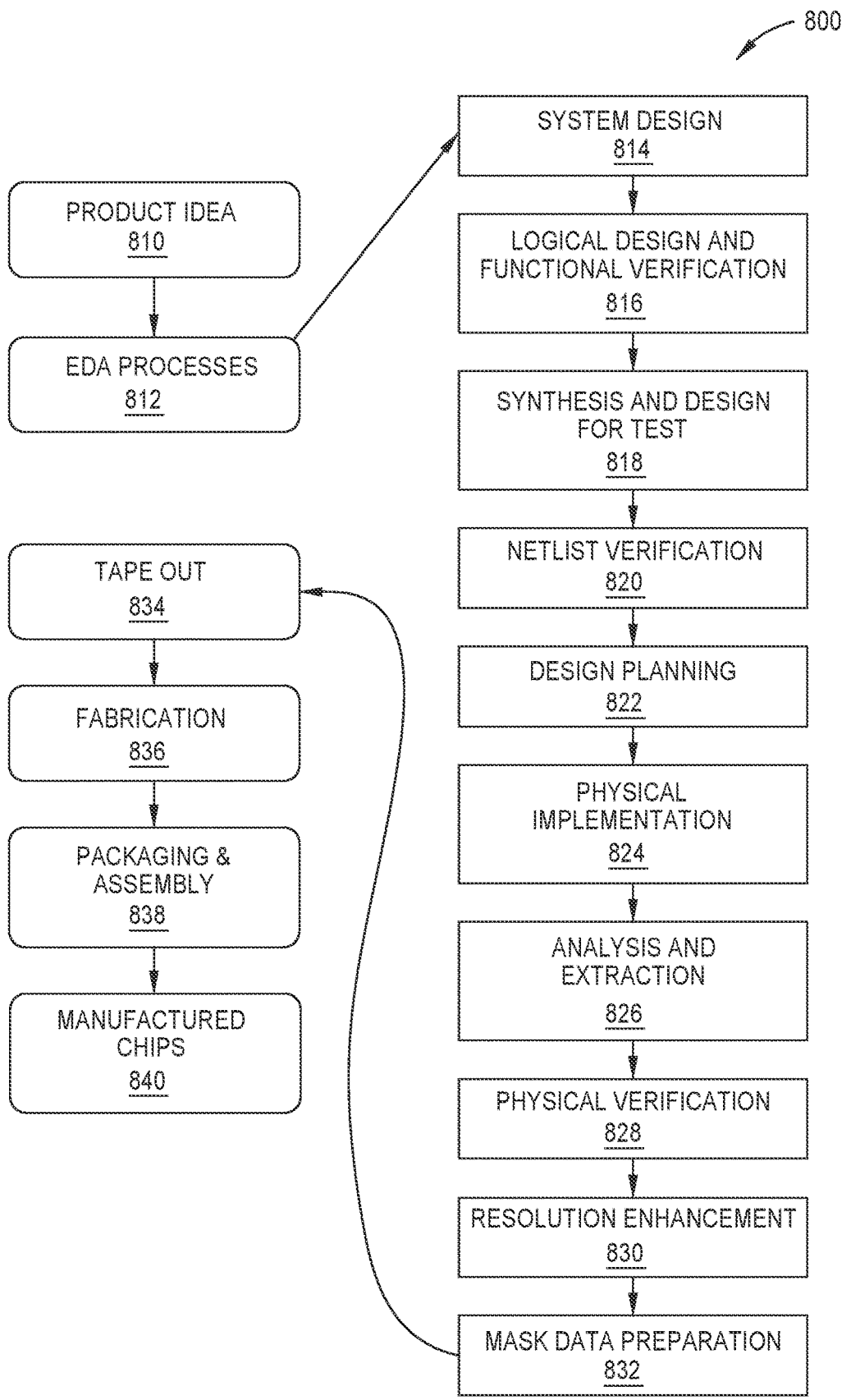
FIG. 8 depicts a flowchart of various processes used during the design and manufacture of an integrated circuit in accordance with some embodiments of the present disclosure.

FIG. 8 illustrates an example set of processes 800 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation'. These processes start with the creation of a product idea 810 with information supplied by a designer, information which is transformed to create an article of manufacture that uses a set of EDA processes 812. When the design is finalized, the design is taped-out 834, which is when artwork (e.g., geometric patterns) for the integrated circuit is sent to a fabrication facility to manufacture the mask set, which is then used to manufacture the integrated circuit. After tape-out, a semiconductor die is fabricated 836 and packaging and assembly processes 838 are performed to produce the finished integrated circuit 840. In some embodiments, the BIST circuit 102 tests rows of the memory 108 for row hammering vulnerabilities after the packaging and assembly processes 838.

Specifications for a circuit or electronic structure may range from low-level transistor material layouts to high-level description languages. A high-level of representation may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding systems of that layer (e.g., a formal verification system). A design process may use a sequence depicted in FIG. 8. The processes described by be enabled by EDA products (or EDA systems).

During system design 814, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 816, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 818, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 820, the netlist is checked for compliance with timing constraints and for correspondence with the HDL code. During design planning 822, an overall floor plan for the integrated circuit is constructed and analyzed for timing and top-level routing.

During layout or physical implementation 824, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 826, the circuit function is verified at the layout level, which permits refinement of the layout design. During physical verification 828, the layout design is checked to ensure that manufacturing constraints are correct, such as DRC constraints, electrical constraints, lithographic constraints, and that circuitry function matches the HDL design specification. During resolution enhancement 830, the geometry of the layout is transformed to improve how the circuit design is manufactured.

During tape-out, data is created to be used (after lithographic enhancements are applied if appropriate) for production of lithography masks. During mask data preparation 832, the 'tape-out' data is used to produce lithography masks that are used to produce finished integrated circuits.

A storage subsystem of a computer system (such as computer system 900 of FIG. 9) may be used to store the programs and data structures that are used by some or all of the EDA products described herein, and products used for development of cells for the library and for physical and logical design that use the library.

Figure 9:
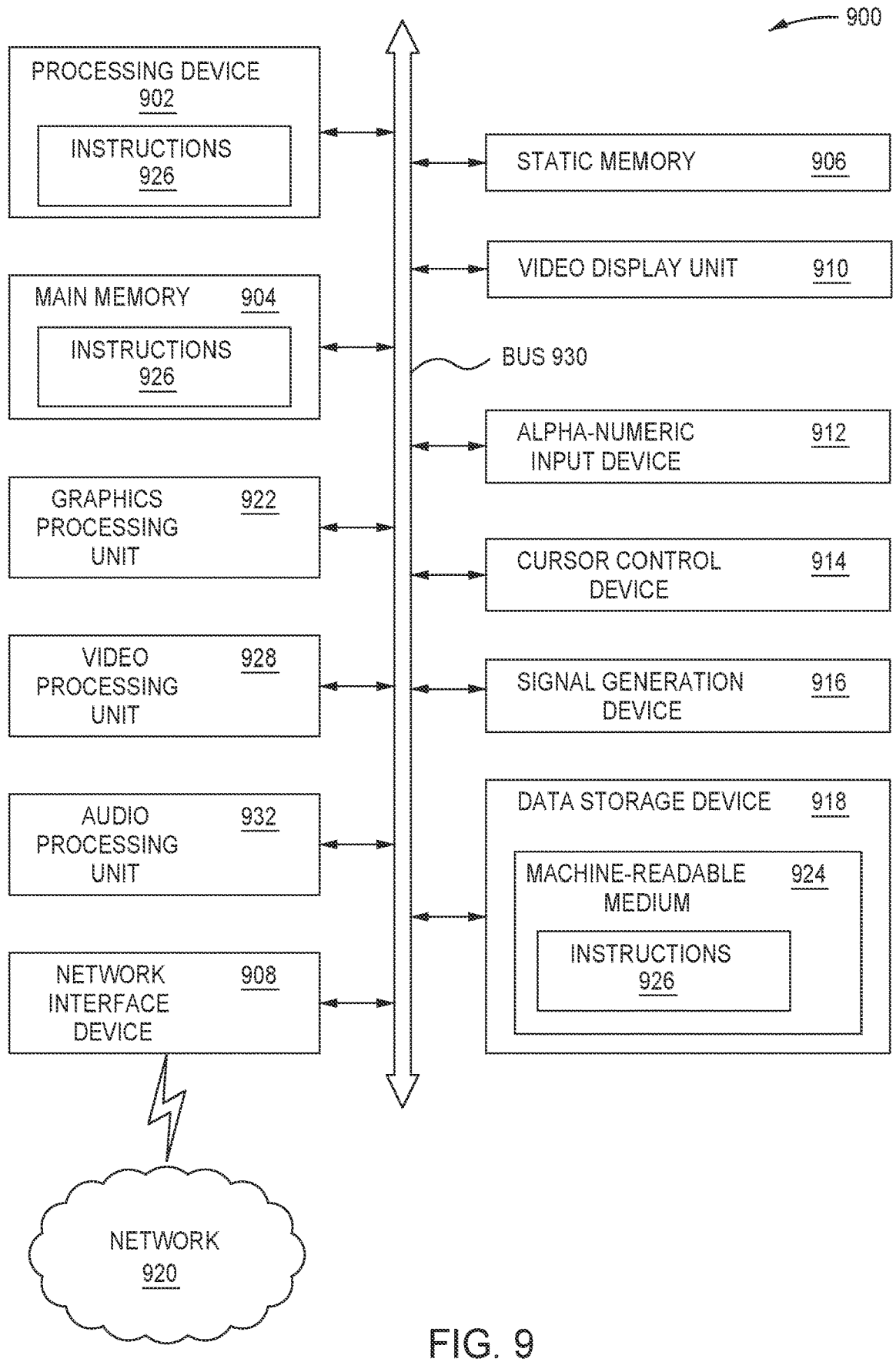
FIG. 9 depicts a diagram of an example computer system in which embodiments of the present disclosure may operate.

FIG. 9 illustrates an example machine of a computer system 900 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM), a static memory 906 (e.g., flash memory, static random access memory (SRAM), etc.), and a data storage device 918, which communicate with each other via a bus 930.

Processing device 902 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 may also be one or more special-purpose processing devices such as an application specific integrated circuit (ASIC), a field programmable gate array (FPGA), a digital signal processor (DSP), network processor, or the like. The processing device 902 may be configured to execute instructions 926 for performing the operations and steps described herein.

The computer system 900 may further include a network interface device 908 to communicate over the network 920. The computer system 900 also may include a video display unit 910 (e.g., a liquid crystal display (LCD) or a cathode ray tube (CRT)), an alphanumeric input device 912 (e.g., a keyboard), a cursor control device 914 (e.g., a mouse), a graphics processing unit 922, a signal generation device 916 (e.g., a speaker), graphics processing unit 922, video processing unit 928, and audio processing unit 932.

The data storage device 918 may include a machine-readable storage medium 924 (also known as a non-transitory computer-readable medium) on which is stored one or more sets of instructions 926 or software embodying any one or more of the methodologies or functions described herein. The instructions 926 may also reside, completely or at least partially, within the main memory 904 and/or within the processing device 902 during execution thereof by the computer system 900, the main memory 904 and the processing device 902 also constituting machine-readable storage media.

In some implementations, the instructions 926 include instructions to implement functionality corresponding to the present disclosure. While the machine-readable storage medium 924 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 902 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method for testing a chip, the method comprising:
   receiving an address range of a dynamic random access memory for testing;
   based on determining that a first row of the dynamic random access memory is in the address range, writing, by a built-in self-test (BIST) circuit of the chip and according to a system clock, the first row of the dynamic random access memory with a first set of values;

reading, by the BIST circuit and according to the system clock, a second row of the dynamic random access memory a first plurality of times, wherein the second row is adjacent to the first row;

reading, by the BIST circuit and according to the system clock, a third row of the dynamic random access memory a second plurality of times, wherein the third row is adjacent to the first row and different from the second row;

after reading the second row the first plurality of times and the third row the second plurality of times, reading, by the BIST circuit and according to the system clock, the first row to extract a second set of values from the first row;

based on determining that at least one of the second set of values differs from a corresponding one of the first set of values, designating the first row as a vulnerable row; and writing, according to the system clock, a portion of data to a fourth row of the dynamic random access memory rather than the first row based on designating the first row as a vulnerable row.

2. The method of claim 1, wherein reading the second row the first plurality of times causes the corresponding one of the first set of values to change to the at least one of the second set of values.

3. The method of claim 1, wherein the at least one of the second set of values comprises a flipped bit relative to the corresponding one of the first set of values.

4. The method of claim 1, wherein the chip is packaged.

5. The method of claim 1, further comprising programming the BIST circuit to designate the first row as a vulnerable row based on determining that the at least one of the second set of values differs from the corresponding one of the first set of values.

6. A chip comprising:
a dynamic random access memory; and
a built-in self-test (BIST) circuit configured to:
write, according to a system clock, a first row of the dynamic random access memory with a first set of values;
read, according to the system clock, a second row of the dynamic random access memory a first plurality of times, wherein the second row is adjacent to the first row;
read, according to the system clock, a third row of the dynamic random access memory a second plurality of times, wherein the third row is adjacent to the first row and different from the second row;
after reading the second row the first plurality of times and the third row the second plurality of times, read, according to the system clock, the first row to extract a second set of values from the first row; and
based on determining that at least one of the second set of values differs from a corresponding one of the first set of values, designate the first row as a vulnerable row; and
a memory controller configured to write, according to the system clock, a portion of data to a fourth row of the dynamic random access memory rather than the first row based on designating the first row as a vulnerable row.

7. The chip of claim 6, wherein reading the second row the first plurality of times causes the corresponding one of the first set of values to change to the at least one of the second set of values.

8. The chip of claim 6, wherein the at least one of the second set of values comprises a flipped bit relative to the corresponding one of the first set of values.

9. The chip of claim 6, further comprising a packaging around the dynamic random access memory and the BIST circuit.

10. The chip of claim 6, wherein the BIST circuit executes instructions to designate the first row as a vulnerable row based on determining that the at least one of the second set of values differs from the corresponding one of the first set of values.

11. A non-transitory computer readable medium storing instructions that, when executed by a processor, cause the processor to:
receive, from a user, an address range of a dynamic random access memory for testing;
based on determining that a first row of the dynamic random access memory is in the address range, initialize, by a built-in self-test (BIST) circuit of a chip, the first row, a second row, and a third row of the dynamic random access memory, wherein the first row is initialized with a first set of values, wherein the second row is different from the third row;
write, by the BIST circuit and according to a system clock, the first row with a second set of values opposite to the first set of values;
read, by the BIST circuit and according to the system clock, the second row and the third row a plurality of times;
after reading the second row and the third row the plurality of times, read, by the BIST circuit an according to the system clock, the first row to extract a third set of values from the first row; and
based on determining that at least one of the third set of values differs from a corresponding one of the second set of values, write, according to the system clock, a portion of data to a fourth row of the dynamic random access memory rather than the first row.

12. The medium of claim 11, wherein the processor further designates the first row as a vulnerable row based on determining that the at least one of the third set of values differs from the corresponding one of the second set of values.

13. The medium of claim 12, wherein the BIST circuit is programmed to designate the first row as a vulnerable row based on determining that the at least one of the third set of values differs from the corresponding one of the second set of values.

14. The medium of claim 13, wherein the processor further re-programs the BIST circuit after designating the first row as a vulnerable row.

15. The medium of claim 11, wherein the at least one of the third set of values comprises a flipped bit relative to the corresponding one of the second set of values.

16. The medium of claim 11, wherein the chip is packaged.

* * * * *